(12) United States Patent
Sangiah et al.

(10) Patent No.: US 9,447,797 B2
(45) Date of Patent: Sep. 20, 2016

(54) SERVOVALVE ACTUATION

(75) Inventors: Dhinesh Sangiah, Pussellawa (LK);
Paul Guerrier, Tewkesbury (GB);
Gary Powers, Tewkesbury (GB)

(73) Assignee: Moog Controls Ltd., Tewkesbury (GB)

( * ) Notice: Subject to any disclaimer, the term of this patent is extended or adjusted under 35 U.S.C. 154(b) by 0 days.

(21) Appl. No.: 14/004,737

(22) PCT Filed: Mar. 15, 2011

(86) PCT No.: PCT/GB2011/050502
§ 371 (c)(1),
(2), (4) Date: Oct. 18, 2013

(87) PCT Pub. No.: WO2012/123691
PCT Pub. Date: Sep. 20, 2012

(65) Prior Publication Data
US 2014/0042346 A1 Feb. 13, 2014

(51) Int. Cl.
| | | |
|---|---|---|
| *F16K 31/00* | (2006.01) | |
| *F15B 13/043* | (2006.01) | |
| *F16K 31/363* | (2006.01) | |
| *B21D 53/00* | (2006.01) | |
| *H01L 41/09* | (2006.01) | |

(52) U.S. Cl.
CPC ............ *F15B 13/043* (2013.01); *B21D 53/00* (2013.01); *F15B 13/0436* (2013.01); *F16K 31/006* (2013.01); *F16K 31/363* (2013.01); *H01L 41/094* (2013.01); *Y10T 29/49405* (2015.01); *Y10T 137/2322* (2015.04)

(58) Field of Classification Search
CPC .. F15C 3/14; F16B 13/0436; F16B 13/0438; F16B 13/16; F16K 31/006; F16K 31/128; F16K 31/42; H01L 41/094; Y10T 137/2278; Y10T 137/2409; Y10T 137/2322; Y10T 137/86614
USPC ...................... 137/82, 83; 251/30.01, 129.06
See application file for complete search history.

(56) References Cited

U.S. PATENT DOCUMENTS

| | | | | |
|---|---|---|---|---|
| 3,286,719 | A | * | 11/1966 | Myers .............................. 137/83 |
| 3,405,727 | A | * | 10/1968 | Hill ................................. 137/83 |
| 3,618,636 | A | | 11/1971 | Grimland et al. |
| 4,227,443 | A | * | 10/1980 | Toot ................................ 91/459 |
| 4,298,181 | A | | 11/1981 | Corrado et al. |
| 4,705,059 | A | | 11/1987 | Lecerf et al. |
| 4,959,581 | A | * | 9/1990 | Dantlgraber .............. F15C 3/14 |
| | | | | 137/625.61 |
| 2010/0004605 | A1 | | 1/2010 | Luther et al. |

FOREIGN PATENT DOCUMENTS

| | | |
|---|---|---|
| GB | 2176314 | 12/1986 |
| JP | 62-24004 | 2/1987 |

OTHER PUBLICATIONS

WIPO, International Preliminary Report on Patentability for PCT/GB2011/050502, Sep. 17, 2013.

* cited by examiner

*Primary Examiner* — Matthew W Jellett
(74) *Attorney, Agent, or Firm* — Hodgson Russ LLP (57) ABSTRACT

A servovalve pilot stage (100) comprises a piezoelectric actuator (130) joined to a flow guide (132) and feedback wire (136) for connection to a main stage spool valve. The flow guide (132) and the piezoelectric actuator (130) may be integral.

17 Claims, 6 Drawing Sheets

SERVOVALVE ACTUATION

The present invention is concerned with servovalves. More particularly, the present invention is concerned with a pilot stage assembly for a deflector jet servovalve for control of fluid flow in, e.g. automotive or aerospace fuel systems.

Known servovalves generally comprise a pilot stage and a main stage. The main stage commonly comprises a shuttle or spool valve which controls the flow of a fluid by selectively opening and closing fluid passages spaced around it. The moveable part of the shuttle valve (known as the spool) is moved in an axial direction by selective application of fluid pressure to each end. The pressure at each end of the spool is controlled by a pilot stage assembly.

The way in which the pilot stage controls the flow of fluid to the ends of the spool varies between different types of servovalve. Known types include nozzle flapper valves (in which an actuated flapper selectively covers fluid channels), jet pipe valves (in which a jet of fluid passing through an actuated pipe is selectively directed to inlet channels) and deflector jet valves (in which a flow guide is used to selectively direct flow to inlet channels).

The present invention is primarily concerned with the latter.

In deflector jet valves, an actuator is cantilevered from a first end and comprises a flow guide having an orifice at a second end which is arranged to direct a jet of fluid from a high pressure area into a first or second fluid channel. Each of the channels is in fluid communication with a respective end of the spool and, as such, can control movement of the spool to influence the fluid flow through the valve. Deflector jet valves are known and manufactured by the applicant.

The flow guide is moved by applying a torque to the first end of the actuator. The first end of the actuator comprises an armature which is actuable by electromagnets to produce the torque.

A known problem with deflector jet type valves is that the electro-mechanical side of the pilot stage must be separated from the working hydraulic fluid. As such, the actuator is normally contained within a flexure sleeve which acts as a barrier between the "wet" hydraulic side of the system and the "dry" electromagnetic side. The flexure sleeve is usually thin-walled metal material and can elastically deform as the actuator moves.

The inclusion of the flexure sleeve makes manufacture and assembly of the servovalve pilot stage expensive and time consuming, not least because the flexure sleeve needs to be manufactured to an extremely fine tolerance in order to provide the desired mechanical characteristics.

It is an object of the present invention to overcome or at least mitigate the above mentioned problem.

According to the present invention there is provided a servovalve pilot stage assembly comprising:
a housing,
an amplifier having an amplifier segment defining an amplifier segment slot,
a multilayered piezoelectric actuator being mounted to the housing at a first end and having a flow guide mounted at a second end, which flow guide is arranged for movement within the amplifier segment slot.

Preferably the servovalve is a deflector jet type servovalve.

By providing a piezoelectric actuator, the architecture of the servovalve is significantly simplified and, more importantly, piezoelectric elements are able to work within a hydraulic fluid. As such, there is no need to separate "wet" and "dry" sides of the pilot stage.

Preferably the pilot stage comprises a feedback member extending from the flow guide away from the piezoelectric actuator, the feedback member configured to be driven by a main stage spool in use.

Provision of a feed back member permits greater control because a hydro-mechanical negative feedback loop is formed with the spool.

Preferably the housing comprises a pressure vessel, and the actuator is immersed in a hydraulic fluid within the pressure vessel.

Advantageously, by immersing the actuator within hydraulic fluid, it is thereby damped which improves the dynamic performance and reduces sensitivity to external inputs which detrimentally affect the current lightly damped systems.

Preferably the flow guide comprises a base portion which extends into the piezoelectric actuator.

Preferably the flow guide, base portion and feedback wire are unitary.

Preferably the base portion extends through the entire length of the actuator.

Preferably the housing comprises a two-part clamp, and the first end of the actuator is secured between the two parts of the clamp.

Preferably the two part clamp is fitted within a pressure vessel to retain the clamp parts together.

The invention also provides a servovalve comprising a pilot stage assembly according to the first aspect, and, a main stage comprising a spool, wherein movement of the spool is controlled by pressures within the amplifier segment slot.

Preferably the piezoelectric actuator is mounted to the housing at a first point, the flow guide is mounted to the piezoelectric actuator at a second point and the feedback member comprises an attachment region for attachment to a main stage spool at a third point, wherein the spool defines a first axis of movement, and in which the first and third points are located between the second point and the spool in a second axis perpendicular to the first axis.

This arrangement moves the centre of mass of the arrangement closer to the centre of rotation which reduces the occurrence of external vibration damage.

Preferably the piezoelectric actuator is parallel and offset from the feedback wire.

Preferably a feedback mechanism is provided arranged to provide negative feedback from movement of the spool to movement of the piezoelectric actuator. Preferably the feedback mechanism comprises a movement transducer arranged to measure movement of the spool. The feedback mechanism may be configured to control an electrical input to the piezoelectric actuator.

According to a second aspect of the invention there is provided a piezoelectric actuator for a servovalve pilot stage having a flow guide extending from a first end, the flow guide comprising a base portion integral therewith which extends into the piezoelectric actuator.

Preferably the base portion extends through the entire length of the actuator.

Preferably a feedback wire extends from and is integral with the flow guide.

The invention also provides a servovalve pilot stage assembly comprising a housing, a piezoelectric actuator according to the second aspect, the actuator being mounted to the housing at a second end.

According to a third aspect of the invention there is provided a method of manufacture of a piezoelectric actuator for a pilot stage of a servovalve comprising the steps of providing a flow guide having an integral base portion extending therefrom, depositing piezoelectric material onto the flow guide to form a piezoelectric actuator.

A servovalve in accordance with the present invention will now be described by way of example with reference to the accompanying figures in which.

Figure 1:
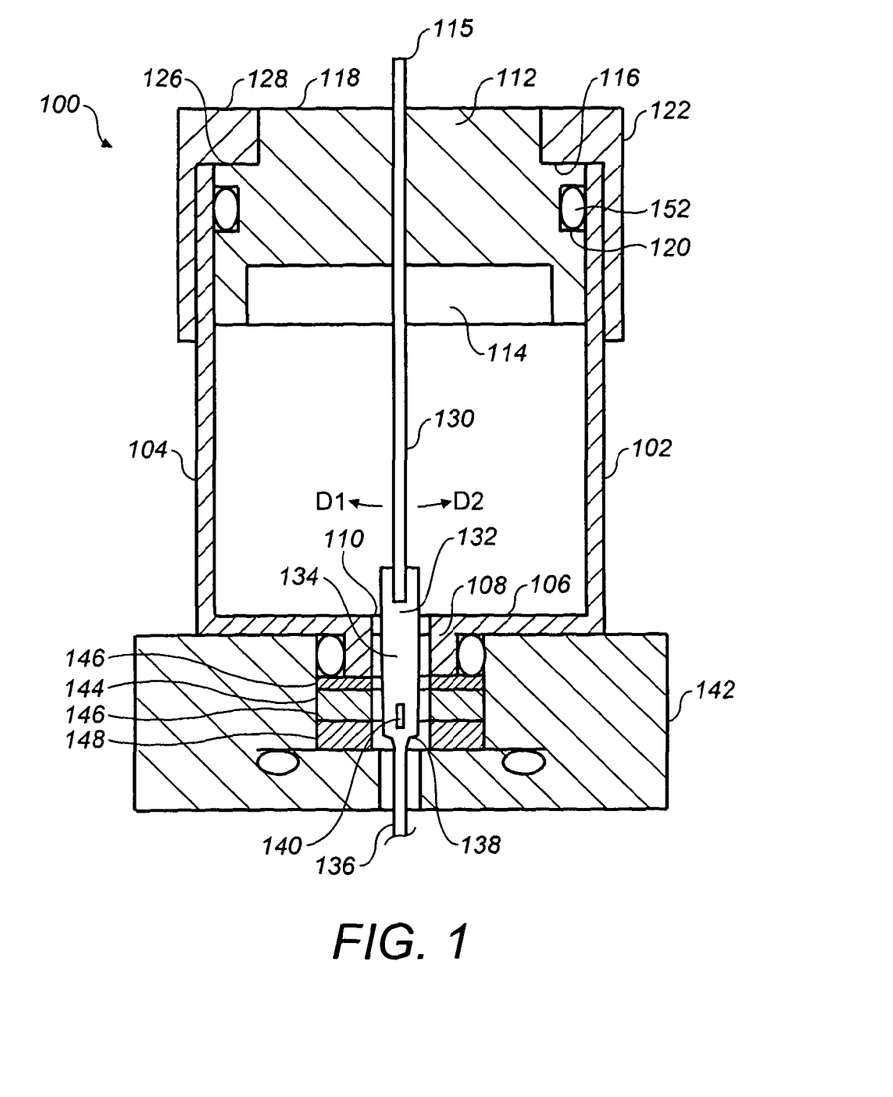
FIG. 1 is a side section view of a first servovalve pilot stage in accordance with the present invention.
Figure 2:
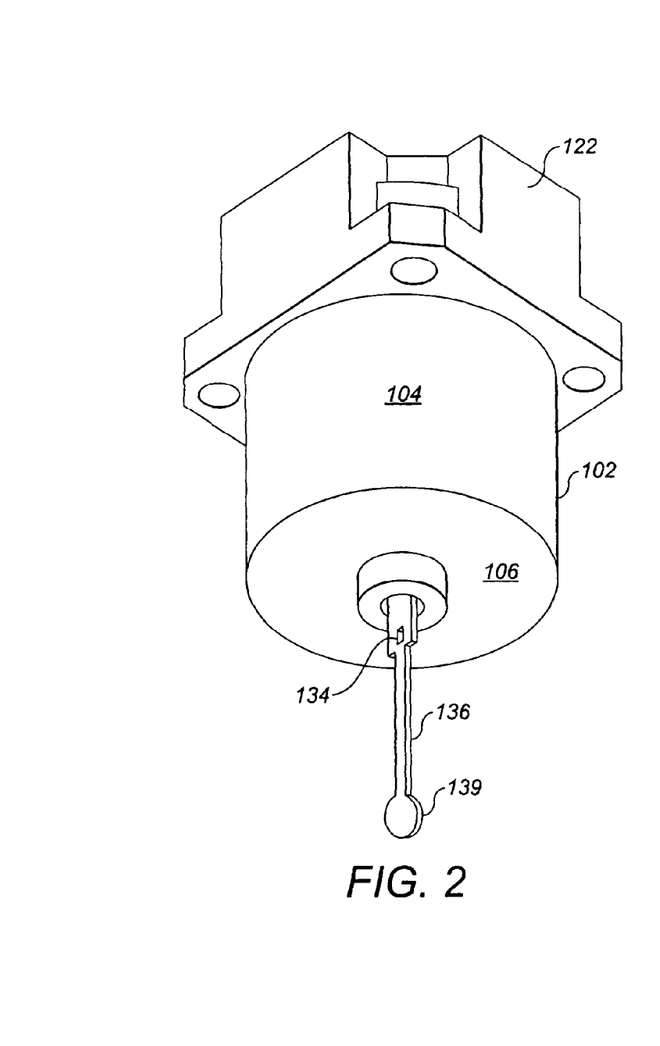
FIG. 2 is of a perspective view of the servovalve pilot stage of FIG. 1.
Figure 3:
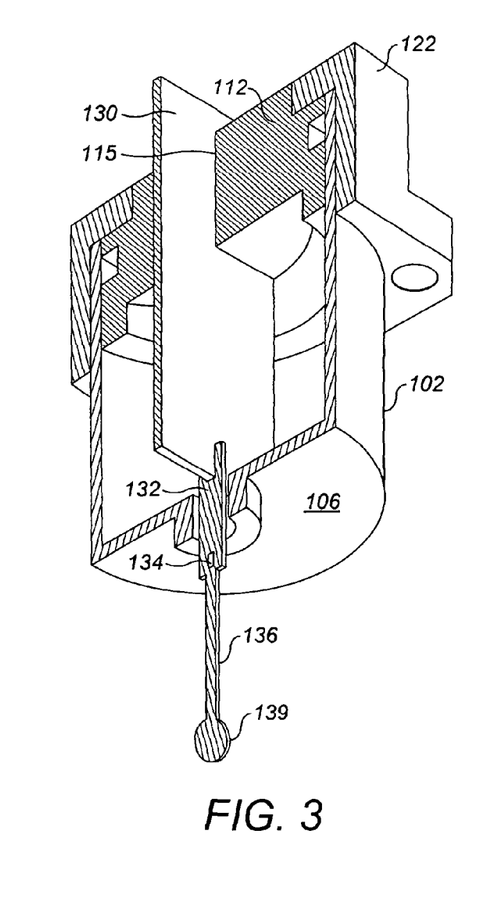
FIG. 3 is a partially cut-away perspective view of the servovalve pilot stage of FIG. 1.

Turning to FIGS. 1 to 3, a servovalve pilot stage assembly 100 is shown. The assembly 100 comprises a pressure vessel 102, having a generally cylindrical body 104 terminated by an annular end region 106 defining a central coaxial axially extending collar 108 surrounding a bore 110.

A header 112 is provided being generally cylindrical and having a shallow cylindrical blind bore 114 defined in a first axial end and a shoulder 116 defined in a second axial end leading to a reduced diameter portion 118. A circumferential o-ring groove 120 is provided midway along the axial length of the header 112.

An end cap 122 is provided which comprises a generally cylindrical hollow sleeve 124, having a shoulder 126, leading to an end portion 128 having a reduced inside diameter.

A generally flat, cuboid piezoelectric element 130 is provided (shown in section through its thickness in FIG. 1). The element 130 is a bimorph multilayered piezoelectric actuator. A multilayered piezoelectric actuator comprises at least one piezoelectric layer. It may also comprise an additional inactive layer (unimorph) or a further active piezoelectric layer (bimorph). More than two piezoelectric layers may be provided (multimorph). Such actuators usually comprise several alternating layers of piezoelectric material which undergo deformation when a potential difference is applied thereto. In this instance, the layers are vertical and planar perpendicular to the page.

A flow guide 132 is provided having a substantially flat cuboid part 134 leading to a feedback wire 136 at a neck 138. The wire terminates in a spool attachment point 139. The flat part 134 of the flow guide 132 defines a rectangular orifice 140, formed by EDM (electro-discharge machining) the function of which will be described below.

A main stage spool valve (not shown) is contained within housing 142 and comprises a generally circular blind bore 144 into which an amplifier cover 146, an amplifier segment 148, and an amplifier base 150 are stacked, each of which has a central bore.

When assembled, the header 112 is assembled with an o-ring 152 within groove 120 and is interference fitted to the body 104 of the pressure vessel 102. The retainer 122 is placed over the shoulder 116 of the header 112 to keep it in place. These three components can be interference fitted together or, alternatively, mechanically secured (for example, through bolts extending from the retainer 122).

The piezoelectric element 130 is fitted within slot 115 of the header 112 so it forms a fluid tight seal therewith and extends therethrough for connection to an electric power supply (not shown). The flow guide 132 is attached to a second end of the piezoelectric element 130 and is attached thereto with an adhesive such that the two components are non-moveable relative to each other.

As such the flow guide 132 and feedback wire 136 project from the bottom of the pilot stage assembly as shown in FIG. 2.

The pilot stage assembly 100 can then be fitted to a main stage (as described below).

As mentioned previously, in use the piezoelectric element 130 can be supplied with a potential difference in order to move the flow guide. Movement occurs in the direction of arrows D1 and D2 of FIG. 1 and results in simultaneous movement of the orifice 140 in the flow guide 132.

The feed back wire 136 is connected to the spool via connection point 139 and consequently is configured to provide negative feedback in order to satisfactorily control the system. Movement of the piezoelectric element to the left (in direction D1) provides a jet of pressurised fluid through the orifice 140 into the appropriate channel on the left hand side of the spool valve (not shown), thus pushing the spool valve to the right. Such movement will pull the feedback wire 136 to the right as well, thus attempting to return it to its neutral position. This type of negative feedback can be tuned to provide an appropriate response during actuation.

Figure 4:
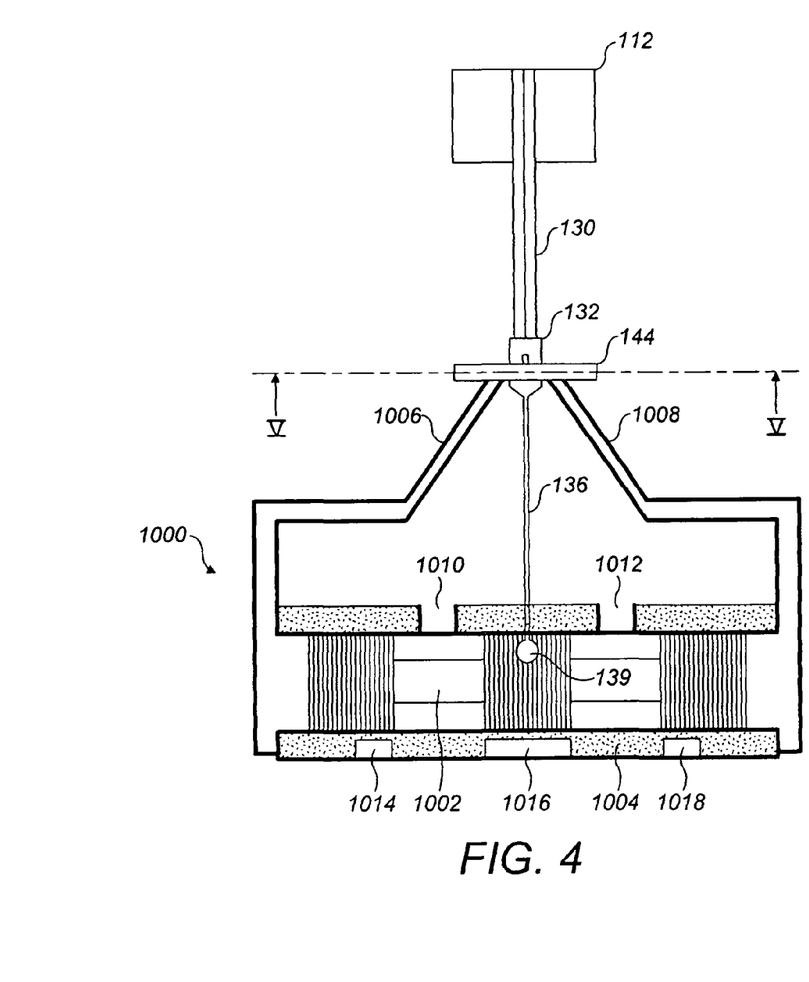
FIG. 4 is a schematic side section view of a part of the servovalve pilot stage of FIGS. 1 to 3 assembled with a main stage spool assembly.

Turning to FIG. 4, part of the header 112 is shown with the piezoelectric element 130 and the attached flow guide 132 and feedback wire 136. The feedback wire connection point 139 is shown as well as the amplifier segment 144.

A main stage 1000 is shown schematically, having a spool valve 1002 which is movable within a cylinder 1004. A first control port 1006 and a second control port 1008 are provided in fluid communication with respective opposite ends of the spool 1002. By varying the pressures at the control ports 1006, 1008, the spool 1002 can be moved axially in the cylinder 1004 to control the flow between flow channels 1010, 1012, 1014, 1016, 1018.

Figure 5:
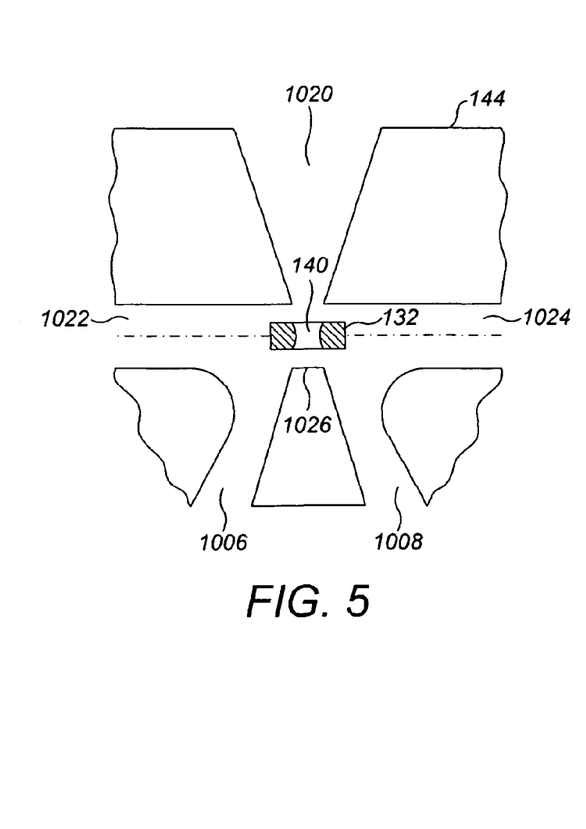
FIG. 5 is a section through a component of the assembly of FIG. 4 along the line V-V.

Referring to FIG. 5, a section through the amplifier segment 144 is shown. The segment defines an inlet 1020, first and second outlets 1022, 1024 and is in fluid communication with ports 1006, 1008. In the null position of the flow guide 132, the inlet flow 1020 is directed to an abutment surface 1026 between the ports 1006, 1008. As such, the pressure at the ports 1006, 1008 is equal.

Actuation of the piezoelectric element 130 moves the flow guide 132 to the left or right (in FIG. 5) to direct the inlet flow through the orifice 140 to either the first port 1006 or the second port 1008 (thus moving the spool to the right or left in FIG. 4 respectively).

The feedback wire 136 is attached to the spool 1002 at point 139. Movement of the flow guide 132 to the left in FIG. 5 (thus pressurising first port 1006) moves the spool to the right in FIG. 4. This movement urges the feedback wire 136 to the right in FIG. 4 and thus provides negative feedback (or a restoring force) on the flow guide 132.

Variations of the above embodiment fall within the scope of the appended claims.

Instead of mechanical feedback., electronic feedback is possible, in which a movement transducer is arranged to record the movement of the spool and used to adjust the electrical input to the piezoelectric actuator.

In order to secure the piezoelectric actuator within the header 112, the header 112 may be constructed as a two-part arrangement which clamps around the element 130. After the element 130 is clamped, the o-ring 152 in installed in the groove 120 and the header 112 inserted into the pressure vessel 102. The interference fit between the header 112 and the pressure vessel 102 is supplemented by the retainer 122 which ensures that the entire assembly is securely fastened.

Alternatively, the header and the actuator may be secured together with adhesive, welded or may be unitary.

Alternatively, the header may be shrink-fitted around the actuator. The header may be constructed from a shape memory allow to facilitate such assembly, which provides secure sealing of the joint and secure mechanical fastening.

Figure 6:
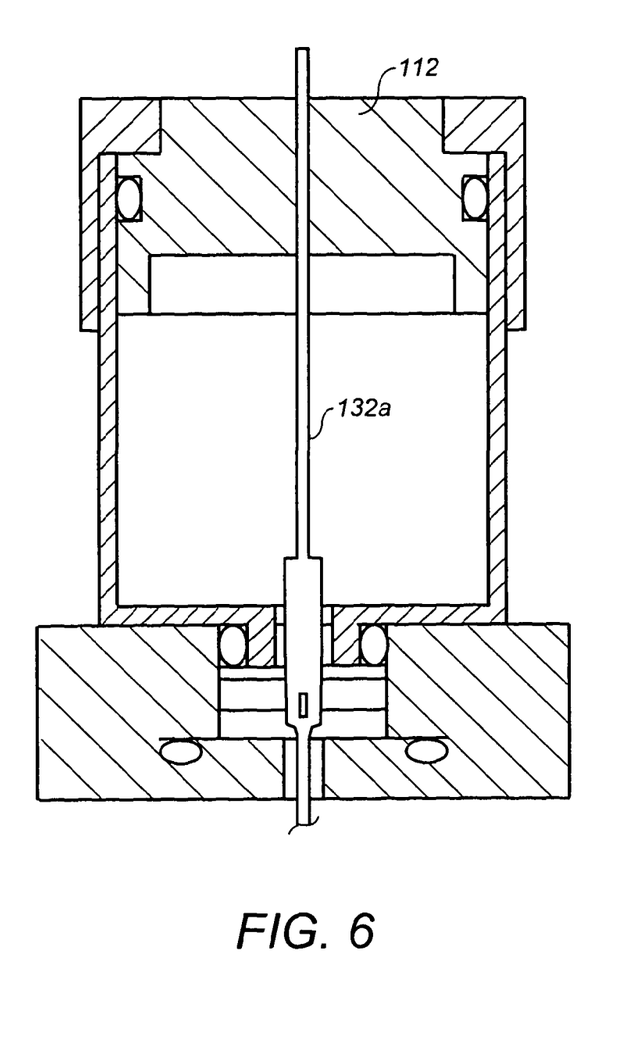
FIG. 6 is a side section view of a second servovalve pilot stage in accordance with the present invention.

In an alternative embodiment, an integral piezoelectric actuator and flow guide is proposed as shown in the servo valve pilot stage of FIG. 6. Reference numerals for common components are labelled per FIGS. 1 to 5.

The integral actuator/flow guide 132*a* is constructed from a single metal base component which defines the flow guide extends partially or fully through the length of the piezoelectric actuator. Preferably the base component extends all the way along the length of the actuator, but less preferably may extend part way, and more preferably most of the way (i.e. more than 50 percent) through.

Such a device can be manufactured by providing a metal base component having a flow guide defined at a first end, and depositing piezoelectric material (active ceramics) onto a second end to form a piezoelectric actuator. The flow guide may be formed by ultrasonic drilling of the base component.

Figure 7:
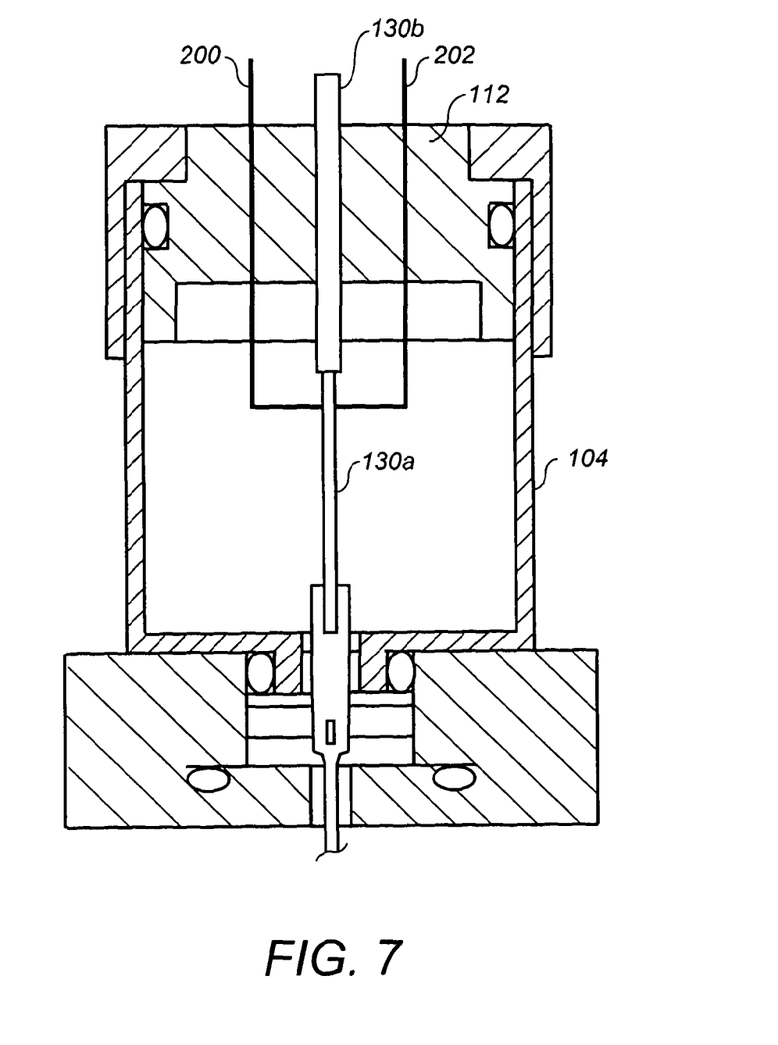
FIG. 7 is a side section view of a third servovalve pilot stage in accordance with the present invention.

In an alternative embodiment shown in FIG. 7, a piezoelectric actuator 130*a* is not clamped directly by the header 112, but is fully immersed in the hydraulic fluid within the body 104. The actuator 130*a* is mounted to a carrier component 130*b* connected to the header 112. Electricity supply wires 200, 202 to the actuator are passed through the header 112 to the actuator. The main advantage of this embodiment is that because the actuator is not embedded within the header 112, the header does not have to seal around a deforming element. This makes sealing simpler and reduces any fatigue on the header 112.

Piezoelectric materials can be deposited in a variety of known manners such as sputtering or any other type of thin filmed deposition. Alternate layers can be built up until a bimorph piezoelectric actuator is formed around the base component. In this manner, the mechanical coupling between the piezoelectric element and the flow guide is guaranteed and the assembly process does not have to account for any kind of joining method such as the aforementioned adhesive.

As an alternative to metal, the base component could be constructed from inactive ceramic.

The arrangement of the piezoelectric element 130, flow guide 132 and feedback wire 136 may be varied as shown in FIGS. 8*a* to 8*d*.

Figure 8A:
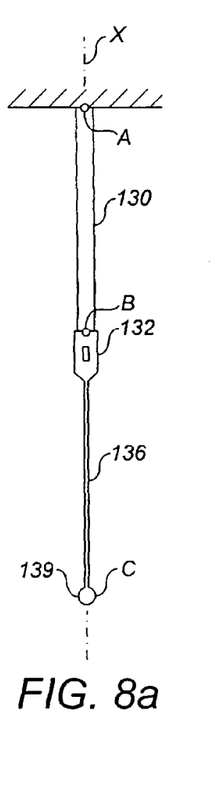
FIG. 8a is a side view of a part of the first servovalve pilot stage.

Referring to FIG. 8*a*, the type of arrangement as used in the previous figures is shown. The piezoelectric element 130 is secured at a point A and is attached to the flow guide at point B (or in the case of an integral actuator and flow guide, point B is where the active material stops). The feedback wire 136 is attached to the spool at point C (i.e. at attachment point 139).

The spool (not shown) has a first axis of travel, and the points A, B and C are aligned on a second axis X, being substantially perpendicular to the first axis. Axis X may also be defined as an axis substantially perpendicular to the direction of travel of the flow guide 132, or substantially perpendicular to the plane of the amplifier segment (not shown).

Figure 8B:
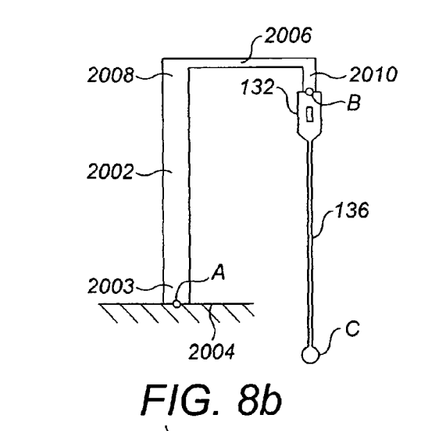
FIG. 8b is a side view of a part of a fourth servovalve pilot stage.
Figure 8C:
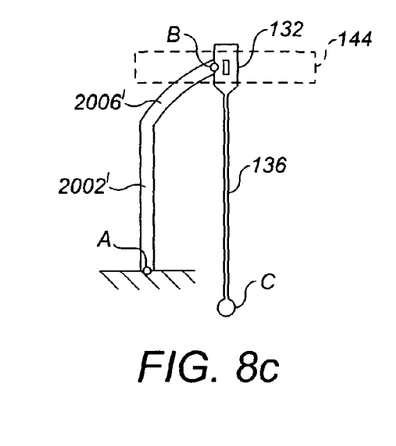
FIG. 8c is a side view of a part of a fifth servovalve pilot stage.
Figure 8D:
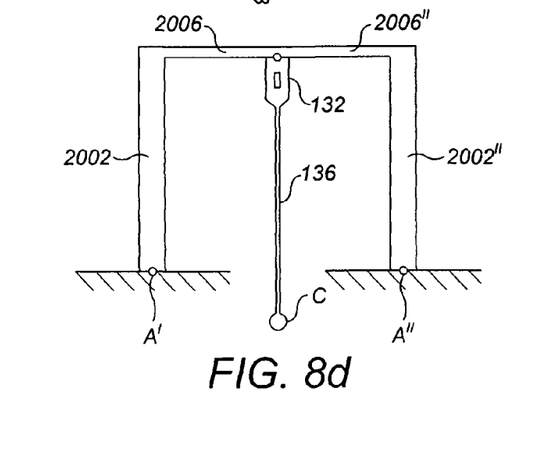
FIG. 8d is a side view of a part of a sixth servovalve pilot stage.

In FIG. 8*a*, the points A, B, C are aligned with B between A and C. In other words points A and C are on opposite sides of point B. Turning to FIGS. 8*b* to 8*d*, three embodiments are shown in which points A and C are on the same side of point B, or disposed between point B and the spool valve.

Turning to FIG. 8*b*, a piezoelectric element 2002 is built in at a first end 2003 at point A to a mount 2004. A cross beam 2006 extends from a second end 2008 of the element (which may be a separate component or integral therewith) to a return section 2010 which joins the flow guide 132 at point B. As a potential difference is applied to the element 2002, it bends so as the second end 2008 pivots thus moving the flow guide 132 to the right and left viewing FIG. 8*b*.

FIG. 8*c* shows a similar arrangement to FIG. 8*b* whereby an element 2002' extends into a curved bridge 2006' which joins the flow guide 132 at the side. The amplifier segment 144 is shown in hidden line, and as can be seen the advantage of the angles, curved bridge 2006' is that it can fit within the segment orifice (specifically the outlet 1022 as shown in FIG. 5).

Finally, FIG. 8*d* shows an arrangement similar to FIG. 8*a* in which a second element 2002" and second bridge 2006" are provided, the bridges 2006, 2006" meeting where the flow guide 132 is attached.

Advantageously, by providing points A and C on the same side of point B, the centre of mass and the centre of rotation of the arrangement are brought closer together. This makes the structure more resilient to damage resulting from external vibration (because the moment arm of the centre of mass relative to the centre of rotation is reduced, thus reducing induced torque and therefore stress).

The relative masses and sixes of the components may be adjusted to achieve this goal. For example, the bridge 2006 has a lower mass than the element 2002 to move the centre of mass further down.

It will be noted that the feedback wire attachment point C is preferably below point A to prevent the mount 2004 from clashing with the main stage assembly.

The above mentioned examples utilise a bimorph piezoelectric actuator that generates a bending moment in response to an applied potential difference. An alternative type of piezoelectric actuator is known as a "stack" actuator and is defined by a plurality of piezoelectric layers stacked in a first direction and connected to a power source in parallel. Upon generation of a potential difference, the stack expands (or contracts) in the first direction. In order to provide the magnitude of motion required by a servovalve, the stack actuator output may be connected to a displacement amplifier such as a lever to increase the displacement produced (at the expense of force). Alternatively, an X-frame displacement amplifying mechanism may be used.

In a further alternative, a piezoelectric shear plate actuator may be used, which comprise a flat plate which undergoes strain in the shear plane when a potential difference is applied. Such plates may be used at the deflector itself (the flow guide being formed in the shear plate).

It will be noted that the pilot stage and main stage may be assembled in a number of ways, although the known method is to bolt them together.

The invention claimed is:

1. A deflector jet servovalve assembly (100) comprising:
   a header (112),
   an amplifier having an amplifier segment (144) defining an amplifier segment bore in flow communication with an inlet (1020), a first control port (1006), and a second control port (1008), wherein the inlet (1020) defines an inlet flow direction,
   a multilayered piezoelectric actuator (130) extending along a longitudinal axis, the piezoelectric actuator (130) having a first end and a second end, the first end of the piezoelectric actuator (130) being mounted to the header (112), and
   a flow guide (132) mounted at the second end of the piezoelectric actuator (130), wherein the flow guide (132) is arranged for movement within the amplifier segment bore and includes a flow orifice (140) to direct flow from the inlet (1020) to the first control port (1006) and the second control port (1008);
   wherein the longitudinal axis of the piezoelectric actuator is perpendicular to the inlet flow direction defined by the inlet (1020).

2. A deflector jet servovalve assembly according to claim 1, further comprising a feedback member (136) extending from the flow guide (132) away from the piezoelectric actuator (130), the feedback member configured to be driven by a main stage spool.

3. A deflector jet servovalve assembly according to claim 1, further comprising a pressure vessel (102), wherein the piezoelectric actuator is immersed in a hydraulic fluid within the pressure vessel.

4. A deflector jet servovalve assembly according to claim 1, wherein the flow guide (132) comprises a base portion which extends into the piezoelectric actuator (130).

5. A deflector jet servovalve assembly according to claim 4, further comprising a feedback member (136) extending from the flow guide (132) away from the piezoelectric actuator (130), the feedback member configured to be driven by a main stage spool, wherein the flow guide, base portion and feedback member are unitary.

6. A deflector jet servovalve assembly according to claim 5, wherein the base portion extends through the entire length of the piezoelectric actuator.

7. A deflector jet servovalve assembly according to claim 1, wherein the header (112) comprises a two-part clamp having opposing clamping portions, and the first end of the actuator is secured between the opposing clamping portions of the two-part clamp.

8. A deflector jet servovalve assembly according to claim 7, wherein the two part clamp is fitted within a pressure vessel (102) to retain the opposing clamping portions of the two-part clamp together.

9. A deflector jet servovalve comprising:
   a deflector jet servovalve assembly (100) according to claim 1, and
   a main stage valve (1000) comprising a spool (1002),
   wherein the first control port (1006) is in fluid communication with a first end of the spool and the second control port (1008) is in fluid communication with a second end of the spool such that movement of the spool is controlled by pressures within the amplifier segment.

10. A deflector jet servovalve assembly according to claim 1, wherein the piezoelectric actuator and the flow guide are constructed as an integral actuator/flow guide (132a).

11. A deflector jet servovalve assembly according to claim 10 wherein the integral actuator/flow guide (132a) comprises piezoelectric material deposited on the flow guide.

12. A deflector jet servovalve comprising:
   a deflector jet servovalve assembly (100) comprising:
      a header (112),
      an amplifier having an amplifier segment (144) defining an amplifier segment bore in flow communication with an inlet (1020), a first control port (1006), and a second control port (1008),
      a multilayered piezoelectric actuator (130) having a first end and a second end, the first end of the piezoelectric actuator (130) being mounted to the header (112), and
      a flow guide (132) mounted at the second end of the piezoelectric actuator (130), wherein the flow guide (132) is arranged for movement within the amplifier segment bore and includes a flow orifice (140) to direct flow from the inlet (1020) to the first control port (1006) and the second control port (1008), and
   a main stage valve (1000) comprising a spool (1002),
   wherein the first control port (1006) is in fluid communication with a first end of the spool and the second control port (1008) is in fluid communication with a second end of the spool such that movement of the spool is controlled by pressures within the amplifier segment,
   wherein the deflector jet servovalve assembly further comprises a feedback member (136) extending from the flow guide (132) away from the piezoelectric actuator (130), the feedback member configured to be driven by the spool (1002) of the main stage valve (1000),
   the piezoelectric actuator is mounted to the header (112) at a first point (A),
   The flow guide is mounted to the piezoelectric actuator at a second point (B),
   the feedback member attached to the spool of the main stage valve at a third point (C), and
   the first point (A) is located between the second point (B) and the third point (C) in a direction perpendicular to an axis of movement of the spool.

13. A deflector jet servovalve according to claim 12, wherein at least a portion of the piezoelectric actuator is parallel to and offset from the feedback member.

14. A piezoelectric actuator device for a deflector jet servovalve having an inlet (1020) defining an inlet flow direction, the piezoelectric actuator device comprising:
   a piezoelectric actuator (130) extending along a longitudinal axis, the piezoelectric actuator (130) having a first end; and
   a flow guide (132) extending from the first end of the piezoelectric actuator (130), the flow guide comprising a base portion integral with the flow guide, the base portion extending into the piezoelectric actuator;
   wherein the longitudinal axis of the piezoelectric actuator is perpendicular to the inlet flow direction defined by the inlet (1020);
   wherein the flow guide (132) includes a flow orifice (140) through which pressurized fluid from the inlet (1020) flows.

15. A piezoelectric actuator assembly according to claim 14, wherein the base portion extends through the entire length of the piezoelectric actuator.

16. A piezoelectric actuator assembly according to claim 14, further comprising a feedback wire extending from and integral with the flow guide.

17. A method of manufacture of a deflector jet servovalve comprising the steps of:
   providing a flow guide having an integral base portion extending therefrom,
   forming an integral actuator/flow guide (132*a*) by depositing piezoelectric material onto the flow guide to form a piezoelectric actuator extending along a longitudinal axis;
   providing a header (112);
   providing an amplifier having an amplifier segment (144) defining an inlet (1020), a first control port (1006), and a second control port (1008), wherein the inlet (1020) defines an inlet flow direction; and
   mounting the integral actuator/flow guide (132*a*) to the header (112) such that the flow guide is positioned within the amplifier segment to direct flow from the inlet (1020) to the first and second control ports (1006, 1008);
   wherein the longitudinal axis of the piezoelectric actuator is perpendicular to the inlet flow direction defined by the inlet (1020);
   wherein the integral actuator/flow guide (132*a*) includes a flow orifice (140) through which pressurized fluid from the inlet (1020) flows to the first control port (1006) and the second control port (1008).

* * * * *